United States Patent
Kinugasa

(10) Patent No.: US 8,692,919 B2
(45) Date of Patent: Apr. 8, 2014

(54) PHOTO-SENSOR, MEASUREMENT APPARATUS AND CAMERA SYSTEM

(75) Inventor: Tomohisa Kinugasa, Yokohama (JP)

(73) Assignee: Canon Kabushiki Kaisha, Tokyo (JP)

( * ) Notice: Subject to any disclaimer, the term of this patent is extended or adjusted under 35 U.S.C. 154(b) by 271 days.

(21) Appl. No.: 13/346,786

(22) Filed: Jan. 10, 2012

(65) Prior Publication Data

US 2012/0113291 A1   May 10, 2012

Related U.S. Application Data

(62) Division of application No. 12/538,430, filed on Aug. 10, 2009, now Pat. No. 8,115,849.

(30) Foreign Application Priority Data

Aug. 18, 2008   (JP) ................................. 2008-209779

(51) Int. Cl.
  *H04N 3/14*   (2006.01)
  *H05B 39/04*   (2006.01)
(52) U.S. Cl.
  USPC ...................... 348/308; 348/294; 250/214 AL
(58) Field of Classification Search
  USPC ................................................. 348/294, 308
  See application file for complete search history.

(56) References Cited

U.S. PATENT DOCUMENTS

| | | | |
|---|---|---|---|
| 6,300,615 B1 | 10/2001 | Shinohara et al. | |
| 6,538,591 B2 * | 3/2003 | Sato et al. ...................... | 341/155 |
| 7,075,051 B2 | 7/2006 | Kashiura et al. | |
| 7,164,114 B2 | 1/2007 | Lai et al. | |
| 8,325,259 B2 * | 12/2012 | Kobayashi et al. ........... | 348/302 |
| 2009/0312987 A1 | 12/2009 | Uedaira et al. | |
| 2010/0134669 A1 | 6/2010 | Kinugasa | |

FOREIGN PATENT DOCUMENTS

| | | |
|---|---|---|
| JP | 63-175467 A | 7/1988 |
| JP | 2000-077644 A | 3/2000 |
| JP | 2000-244004 A | 9/2000 |

* cited by examiner

*Primary Examiner* — Ngoc-Yen Vu
(74) *Attorney, Agent, or Firm* — Fitzpatrick, Cella, Harper & Scinto

(57) ABSTRACT

The present invention provides a photo-sensor with a stable current limiting function and pixel reset function. When the incident light quantity of the phototransistor is equal to or less than a predetermined quantity and the base potential of the phototransistor is in a first potential of an operation point in a stationary state, an MOSFET for discharging an electric charge is controlled so as to be turned OFF. In addition, when the incident light quantity of the phototransistor is equal to or more than the predetermined quantity, a MOSFET for detecting an electric current is controlled so as to operate in a saturation region. When the base potential of the phototransistor has changed to a second potential from the first potential, the MOSFET for discharging an electric charge is controlled so as to be turned ON.

8 Claims, 5 Drawing Sheets

PHOTO-SENSOR, MEASUREMENT APPARATUS AND CAMERA SYSTEM

This application is a division of application Ser. No. 12/538,430 filed Aug. 10, 2009.

BACKGROUND OF THE INVENTION

1. Field of the Invention

The present invention relates to a photo-sensor which converts a photo signal to an electric signal and amplifies the electric signal with a phototransistor, and to a measurement apparatus and a camera system using the same.

2. Description of the Related Art

A photo-sensor for photometry (hereinafter referred to as "AE sensor") which is used in a digital single-lens reflex camera or the like needs to have a wide dynamic range performance that corresponds to a range from a low luminance to a high luminance and have a responsivity of following the change of incident light. As for the dynamic range, a photo-sensor is used which amplifies a photo-current with a phototransistor so as to enhance the measurement accuracy in a low luminance condition, during which a signal to be generated is small.

Such a photo-sensor has a problem that an electric current consumption increases in a high luminance period. For this reason, a method of limiting the electric current consumption of the photo-sensor to a fixed value is employed (hereinafter referred to as "current limiting"). For instance, a system of controlling a portion discharging excessive carrier, based on a signal quantity which has been output from a photoelectric conversion element is employed in a photoelectric conversion apparatus described in Japanese Patent Application Laid-Open No. 2000-244004.

On the other hand, as for the responsivity with respect to the incident light, for instance, a system of varying only an emitter potential without varying the base potential of the phototransistor is employed as is described in Japanese Patent Application Laid-Open No. 2000-77644. Furthermore, FIG. 5 in Japanese Patent Application Laid-Open No. 2000-77644 discloses a circuit configuration for performing the current limiting.

In the photoelectric conversion apparatus of FIG. 1 in Japanese Patent Application Laid-Open No. 2000-244004, when an electric current which has been amplified by the phototransistor exceeds a limit current, a gate potential of a MOSFET for discharging an electric charge abruptly increases due to a MOSFET for detecting an electric current. Then, the MOSFET for discharging an electric charge is turned ON, and thereby an excessive photo-current is discharged through the base of the phototransistor.

In other words, such a feedback circuit is formed that when a base current of the phototransistor changes, a drain voltage of the MOSFET for detecting an electric current changes, and a drain current of the MOSFET for discharging an electric charge changes. Then the base current of the phototransistor changes and the base potential of the phototransistor changes.

In this configuration, the MOSFET for discharging an electric charge controls the base of the phototransistor through a configuration of grounding the source, so once the MOSFET has been turned ON, the MOSFET continues to excessively discharge the photo-current until the gate potential changes by the feedback. A similar feedback occurs when the MOSFET for discharging an electric charge is turned OFF. The decrease of the stability due to a phase delay of this feedback can cause an oscillation state of making the MOSFET for discharging an electric charge switch repeatedly between ON and OFF.

When the MOSFET for discharging an electric charge serves as a reset switching MOSFET for an operation of resetting a pixel, which will be described later, the gate potential of the MOSFET cannot be directly controlled, so a complicated control becomes necessary. Furthermore, there has been a problem that the pixel cannot be reset in some operation conditions.

Also in a circuit which is shown in FIG. 5 of Japanese Patent Application Laid-Open No. 2000-77644, when a base current of the phototransistor changes, a drain voltage of the MOSFET for detecting an electric current changes. Then a drain current of the MOSFET for discharging an electric charge changes, and the base current of the phototransistor changes and the base potential of the phototransistor changes. Accordingly, the circuit of FIG. 5 has the same problem as that of the circuit shown in FIG. 1 of Japanese Patent Application Laid-Open No. 2000-244004.

SUMMARY OF THE INVENTION

An object of the present invention is to provide a photo-sensor, a measurement apparatus, and a camera system which amplify a photo signal with a phototransistor and output the photo signal, which can realize a stable current limiting function and pixel reset function photo-sensor.

A photo-sensor according to the present invention includes: a phototransistor for receiving light to generate a photo-current and to output a current produced by amplifying the photo-current; a first MOSFET for detecting the current from the phototransistor; and a second MOSFET having a one non-controlling terminal connected to a base of the phototransistor, to discharge an excessive photo-current in the phototransistor, wherein the second MOSFET is turned OFF when a light quantity incident in the phototransistor is smaller than a predetermined value and a base potential of the phototransistor is at a first potential, and the first MOSFET operates in a saturation region under a condition that the incident light quantity of the phototransistor is larger than a predetermined value, and a gate potential of the second MOSFET is fixed so that the second MOSFET is turned ON, when the base potential of the phototransistor changes from the first potential to a second potential during a sensor operation period for outputting the photo-current from the phototransistor.

The photo-sensor according to the present invention controls a gate potential of a MOSFET for discharging an electric charge so that the MOSFET for discharging an electric charge is turned ON, when a base potential of the phototransistor has deviated from an operation point in the stationary state by a certain voltage. Therefore, the photo-sensor can eliminate the delay of the phase of the feedback in a current limiting operation and can enhance its stability in the current limiting operation.

Furthermore, the photo-sensor sets a drain potential of the MOSFET for detecting an electric current at an appropriate potential for an operation of resetting the pixel, and thereby can conduct a stable pixel-resetting operation in such a circuit which makes the base potential unchanged as is described in Japanese Patent Application Laid-Open No. 2000-77644 and the like. As a result, a camera system can be realized which mounts an AE sensor thereon that is provided with a stable current limiting function and a pixel reset function without increasing the cost.

Further features of the present invention will become apparent from the following description of exemplary embodiments with reference to the attached drawings.

DESCRIPTION OF THE EMBODIMENTS

Preferred embodiments of the present invention will now be described in detail in accordance with the accompanying drawings.

Embodiment 1

Figure 1:
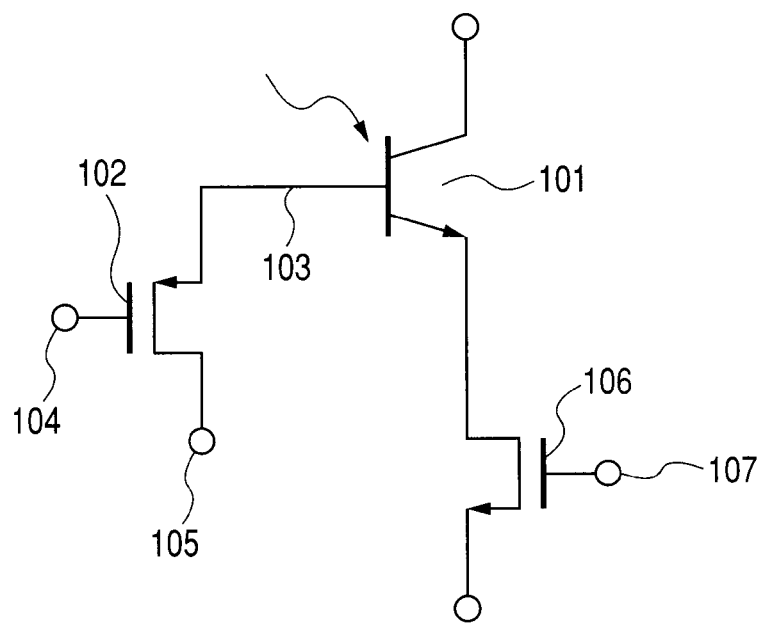
FIG. 1 is a circuit diagram illustrating a photo-sensor according to Embodiment 1 in the present invention.
Figure 2:
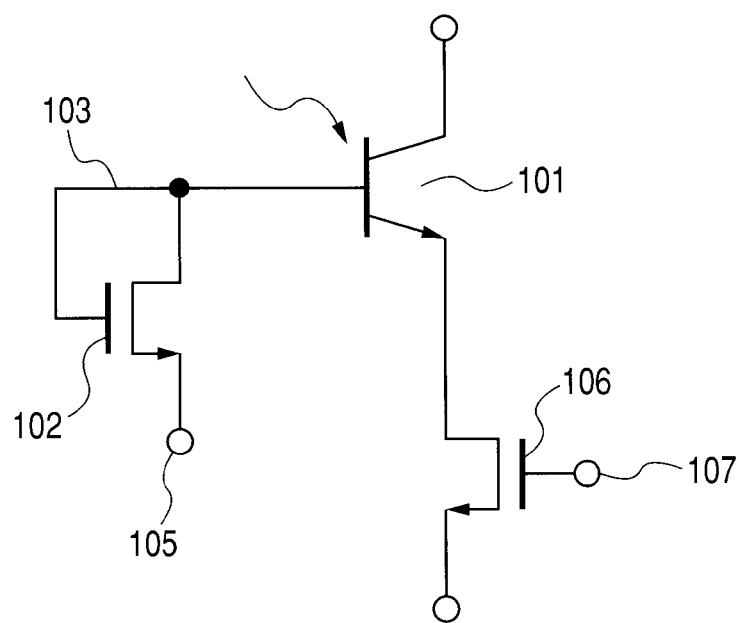
FIG. 2 is a circuit diagram illustrating a photo-sensor according to Embodiment 1 in the present invention.
Figure 3:
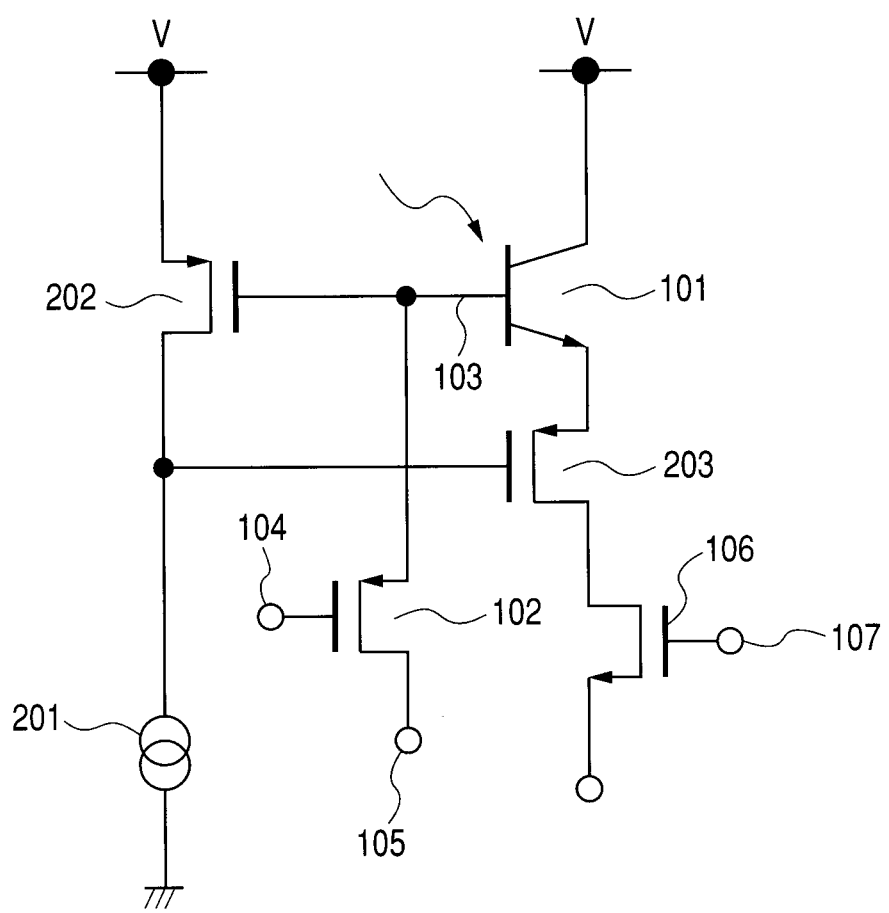
FIG. 3 is a circuit diagram to be employed when a photo-sensor of the present invention is used as an AE sensor.

FIG. 1, FIG. 2 and FIG. 3 are circuit diagrams illustrating a photo-sensor according to Embodiment 1 in the present invention. FIG. 1 is a circuit diagram best illustrating a feature of the present invention. FIG. 2 is a circuit diagram in which the polarity of a MOSFET for discharging an electric charge in FIG. 1 is changed. FIG. 3 is a circuit diagram illustrating one embodiment preferable for the case where the photo-sensor is applied as an AE sensor (light measuring apparatus which is used in a camera and the like) by adding a circuit which makes the base potential of a phototransistor unchanged to the circuit of the photo-sensor in FIG. 1.

In these figures, a phototransistor 101 is a bipolar type. The phototransistor 101 receives a light in a base portion, and outputs an electric current of an amplified photo-current, through an emitter. A MOSFET 102 for discharging an electric charge discharges an excessive photo-current of the phototransistor 101, and a MOSFET 106 for detecting an electric current detects an emitter current of the phototransistor 101. The MOSFET 106 for detecting an electric current is referred to as a first MOSFET, and the MOSFET 102 for discharging an electric charge is referred to as a second MOSFET.

A base terminal 103 of the phototransistor 101, a gate terminal 104 of the MOSFET 102 for discharging an electric charge, a drain terminal 105 of the MOSFET 102 for discharging an electric charge and a gate terminal 107 of the MOSFET 106 for detecting an electric current are also shown in the drawings. An NPN type is used for the phototransistor 101, but a PNP type may be used instead.

In the following description, the base potential of the base terminal 103 of the phototransistor 101 is represented by Vbase, the gate potential of the gate terminal 104 of the MOSFET 102 for discharging an electric charge is represented by Vgate, and the drain potential of the drain terminal 105 of the MOSFET 102 for discharging an electric charge is represented by Vdrain.

In FIG. 1, a drain terminal which is one non-controlling terminal of a MOSFET 106 for detecting an electric current, or a first MOSFET, is connected to an emitter of an output terminal of a phototransistor 101, and works in a saturation region when the current value reaches a predetermined current value. A source terminal which is one non-controlling terminal of a MOSFET 102 for discharging an electric charge, or a second MOSFET is connected to a base terminal 103 of the phototransistor 101. A predetermined potential is applied to a drain terminal 105 that is the other non-controlling terminal of the second MOSFET 102, which will be described later.

In FIG. 2, a source terminal that is one non-controlling terminal of the MOSFET 102 for discharging an electric charge, which is the second MOSFET, and a gate terminal of the MOSFET 102 are connected to the base terminal 103 of the phototransistor 101. A predetermined potential is applied to a drain terminal 105 that is the other non-controlling terminal of the second MOSFET 102, as will be described later. The circuit in FIG. 2 can make the polarities of the MOSFET 106 for detecting an electric current and the MOSFET 102 for discharging an electric charge the same, unlike in FIG. 1. As a result, elements do not need to be separated by a diffusion well, therefore the layout area can be reduced.

Furthermore, in FIG. 3, a current source 201 drives a feedback circuit for making a base potential of the phototransistor 101 unchanged. A MOSFET 202 detects the variation of the base potential of the phototransistor 101 and a MOSFET 203 controls an emitter potential of the phototransistor 101.

Subsequently, the operation will now be described. When a light is incident on a photo-sensor, a photo-current corresponding to light intensity is generated through photoelectric conversion. The generated photo-current flows into a base terminal 103 of a phototransistor 101, and is amplified to be an emitter current. The phototransistor 101 is provided with a feedback circuit as is illustrated in FIG. 3, so as to enhance response characteristics when the light intensity suddenly changes. That is to say, a base potential Vbase of the phototransistor 101 is controlled so as not to deviate from a predetermined operation point (hereinafter referred to as "Vb potential"). In the operation in FIG. 3, the description of a part which overlaps with Japanese Patent Application Laid-Open No. 2000-77644 will be omitted.

Specifically, a gate voltage Vgate is controlled so that when the base potential Vbase of the phototransistor 101 rises to a potential between a potential Vb of a predetermined operation point and a power source voltage V (hereinafter referred to as "Vlimit potential"), the MOSFET 102 for discharging an electric charge is turned ON. In a MOSFET 106 for detecting an electric current, which is a first MOSFET, a potential of a source terminal is fixed, and a gate potential is given to a gate terminal 107 so that the MOSFET 106 operates in a linear region in normal condition, but operates in a saturation region when a drain current equal to or more than the limit current value flows therethrough.

Specific numeric values will be shown below. For instance, a power source voltage V is 5.0 V, a Vb potential is 3.5 V, a Vlimit potential is 4.5 V, a Vgate potential is 3.3 V, a Vdrain potential is 3.6 V, and a threshold voltage of a PMOS is 1.2 V (in consideration of substrate bias effect). In addition, a drain current flowing when the MOSFET 106 for detecting an electric current operates in the saturation region is 200 µA, and the HFE (current amplification factor) of the phototransistor 101 is 100.

Subsequently, a reason why the MOSFET 102 for discharging an electric charge, which is a second MOSFET, is necessary will now be described. At first, when intense light is incident on the photo-sensor and the emitter current of the phototransistor 101 increases to the limit current value or more, an operation region of the MOSFET 106 for detecting an electric current, which is a first MOSFET, shifts to a saturation region from a linear region. Then, the emitter potential of the phototransistor 101 rises to the vicinity of the power source voltage.

At this time, when there is no MOSFET 102 for discharging an electric charge, the phototransistor 101 operates to pass an emitter current equal to or more than a limit current value therein, causing a Vbase potential of the base terminal 103 to rise above the power source voltage. When the Vbase potential exceeds the power source voltage, a collector and a base of the phototransistor 101 are forward-biased, which is originally used in a reverse bias, causing a photo-current to flow to a collector from a base.

The phototransistor 101 normally receives light in a region between the collector and the base. When considering the case where a collector is commonized between adjacent phototransistors, a parasitic bipolar transistor is formed in between the bases of the adjacent phototransistors. When the collector and the base are forward-biased and the current flows to the collector from the base, as was described above, the parasitic bipolar transistor operates, and the current flows to the base of the adjacent phototransistor. As a result, there is a concern that a crosstalk of photo signals occurs between adjacent pixels.

For this reason, the MOSFET 102 for discharging an electric charge, which is a second MOSFET, is employed so as to clip the Vbase potential of the phototransistor 101 at a Vlimit potential lower than the power source voltage, and discharge an excessive photo-current as a drain current of the MOSFET 102 for discharging an electric charge. As a result, the increase of the emitter current of the phototransistor 101 becomes saturated at the limit current value, and the MOSFET 102 can realize a current limiting function.

A difference between the present circuit and a circuit in FIG. 1 of Japanese Patent Application Laid-Open No. 2000-244004 exists in a point that the stability of the present circuit is improved in a period until the photo-current settles in a stationary state in which current limiting operates after an increase of a photo-current followed by the start of discharging an excessive carrier by the turn-on of the MOSFET 102 for discharging an electric charge. The circuit in the present embodiment has the MOSFET 102 which clips the base potential of a phototransistor 101 arranged therein, in place of a source grounded MOS transistor 7 which is used for discharging an electric charge in the circuit of FIG. 1 in Japanese Patent Application Laid-Open No. 2000-244004.

The circuit of FIG. 1 in Japanese Patent Application Laid-Open No. 2000-244004 can cause an oscillation state in which the MOSFET for discharging an electric charge repeats switching between ON and OFF due to a delay of feedback, as was described above. In the circuit of the present embodiment, such a feedback is not formed as is formed in the circuit of FIG. 1 in Japanese Patent Application Laid-Open No. 2000-244004, so the delay of the feedback does not occur in a period after the Vbase potential changes until the drain current of the MOSFET 102 for discharging an electric charge changes. As a result, the concern is removed that the circuit may cause the oscillation state, so the stability of the current limiting operation is improved.

When the photo-sensor according to the present invention is used as an AE sensor, it is necessary to reset a base potential Vbase of the phototransistor 101 to a predetermined voltage (pixel-resetting operation) before its operation, in order to quickly settle the Vbase potential into a stationary state. In order to conduct the pixel-resetting operation, the photo-sensor needs to have a switch element such as a MOSFET provided therein. If a switching MOSFET for resetting a pixel was separately provided therein, the switching MOSFET would cause a problem of lowering the aperture ratio of the AE sensor. Accordingly, it is desirable that the MOSFET 102 for discharging an electric charge also serves as the switching MOSFET.

Because the circuit of FIG. 1 in Japanese Patent Application Laid-Open No. 2000-244004 cannot directly control the gate potential Vgate of a MOSFET for discharging excessive carrier, a complicated control would be required to make the MOSFET 102 for discharging an electric charge to also serve as the resetting MOSFET. In that case, the control method is considered, for instance, which includes turning the MOSFET 106 for detecting an electric current OFF to turn the gate potential Vgate of the MOSFET 102 for discharging an electric charge High.

Furthermore, the circuit configuration of FIG. 1 in Japanese Patent Application Laid-Open No. 2000-244004 has a problem in an operation range. In the circuit of the photo-sensor illustrated in FIG. 3, the base potential Vbase of the phototransistor 101 shows a potential lower than the power source voltage by a threshold voltage and overdrive voltage of a PMOS, and accordingly is set at a high potential which is comparatively close to the power source voltage. In the circuit of FIG. 1 in Japanese Patent Application Laid-Open No. 2000-244004, an NMOS is used in the MOSFET for discharging an electric charge so it is difficult to set the base potential Vbase to a high voltage. Furthermore, the threshold value of an MOSFET increases in a high-temperature state, so a voltage range in which an electric charge can be injected into the base potential Vbase becomes even narrower.

The circuit in the present embodiment directly controls the gate potential Vgate of a gate terminal 104 of the MOSFET 102 for discharging an electric charge, which is a second MOSFET, and therefore can easily make the MOSFET 102 for discharging an electric charge also serve as the resetting MOSFET. In addition, the circuit can use a PMOS as the MOSFET 102 for discharging an electric charge, and the base potential Vbase can accordingly be set at a high potential regardless of the threshold value of the MOSFET.

Figure 4A:
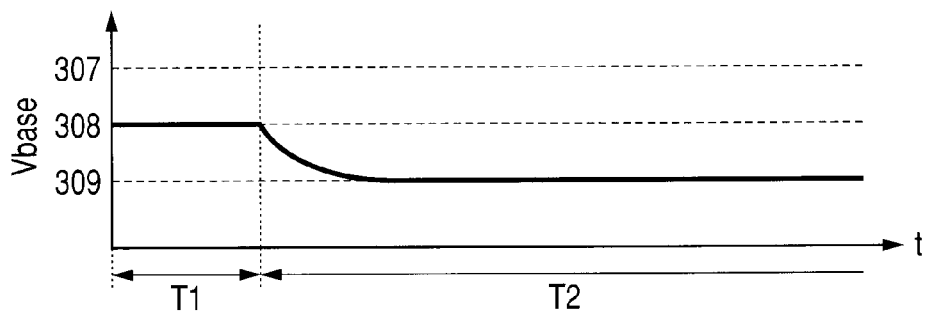
FIGS. 4A, 4B, 4C and 4D are views illustrating an operation timing of Embodiment 1 in the present invention.
Figure 4B:
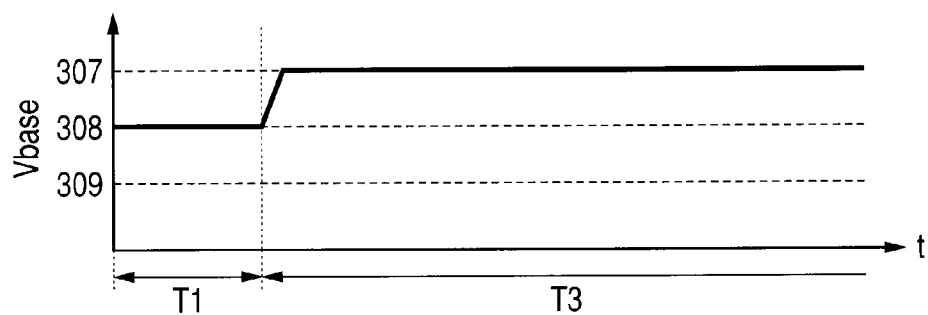

FIGS. 4A to 4D are views illustrating an operation timing of the photo-sensor in FIG. 3. FIGS. 4A to 4D illustrate an operation timing in the case where the photo-sensor performs a pixel-resetting operation as was described above. FIG. 4A illustrates an operation timing in the case of a low luminance (a case where the incident light quantity is equal to or less than predetermined quantity) including a pixel reset period. FIG. 4B illustrates an operation timing in the case of conducting a current limiting operation at a high luminance (a case where the incident light quantity is equal to or more than predetermined quantity) including a pixel reset period.

Figure 4C:
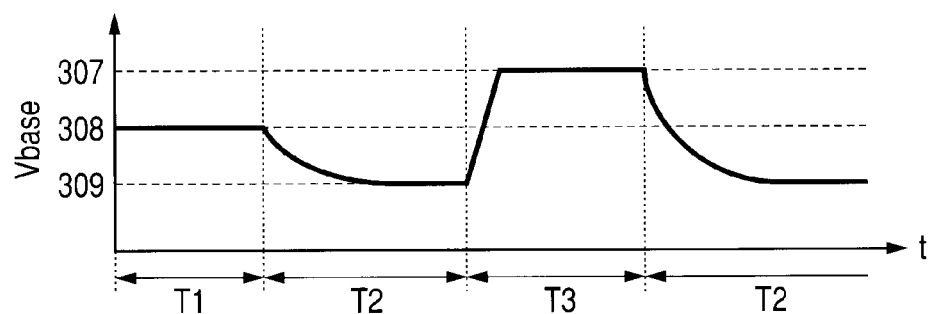
Figure 4D:

FIG. 4C illustrates an operation timing in the case where the incident light quantity changes from a low luminance to a high luminance and to a low luminance again after the photo-sensor performs the pixel-resetting operation and settles in a stationary state. FIG. 4D illustrates the change of a gate potential Vgate of a gate terminal 104 in a MOSFET 102 for discharging an electric charge.

The abscissa axes of FIG. 4A to FIG. 4D represent an elapsed time (t). The ordinate axes of FIG. 4A to FIG. 4C show a Vbase potential of a phototransistor 101. The ordinate axis of FIG. 4D shows a gate potential Vgate of a MOSFET 102 for discharging an electric charge. In addition, in FIGS. 4A to 4D, a pixel reset period T1, a sensor operation period T2 in a low luminance state, and a sensor operation period T3 in a current limiting state are shown.

A potential 307 in FIG. 4A to FIG. 4C is a Vbase potential of a phototransistor 101 when the MOSFET 102 for discharging an electric charge is turned ON, in other words, is a Vlimit potential (second potential). A potential 308 is a Vdrain potential of the MOSFET 102 for discharging an electric charge. A potential 309 is an operation point of the Vbase potential of the phototransistor 101 (hereinafter referred to as "Vb potential") in an operation period in which the MOSFET 102 for discharging an electric charge is not turned ON (first potential). A potential 310 of FIG. 4D shows a set potential of a Vgate potential of the MOSFET 102 for discharging an electric charge in a sensor operation period.

A pixel-resetting operation will now be described with reference to FIGS. 4A to 4D. After a power source is turned on and when the base potential Vbase of the phototransistor 101 is lower than that of the Vb potential 309 which is a potential of a predetermined operation point, because the photo-sensor has to raise the base potential to the Vb potential 309 with an infinitesimal photo-current, the rate of rise becomes very slow. Then, the photo-sensor injects an electric charge into a base terminal 103 of the phototransistor 101 to forcibly raise the Vbase potential of the phototransistor 101 to a higher potential than the Vb potential 309, and then stops the injection.

By the above operation, the electric charge is immediately discharged from the base of the phototransistor 101, and the base potential Vbase of the phototransistor 101 is lowered. It is much faster to discharge the electric charge by using a base current than to inject the electric charge into the base of the phototransistor 101 by using an infinitesimal photo-current. Accordingly, the circuit of FIG. 3 can be quickly settled at a stationary state by providing a pixel reset period T1 as illustrated in FIGS. 4A to 4D.

A photo-sensor in the present embodiment makes a MOSFET 102 for discharging an electric charge, which is a second MOSFET, also serve as a MOSFET for resetting a pixel, as was described above. The photo-sensor turns ON the MOSFET 102 for discharging an electric charge, which is the second MOSFET, in a pixel reset period T1, and sets the Vbase potential of a phototransistor 101 at a Vdrain potential 308 of the MOSFET 102 for discharging an electric charge, as are illustrated in FIGS. 4A to 4D.

The photo-sensor sets the Vgate potential of the MOSFET 102 for discharging an electric charge at a potential 310 illustrated in FIG. 4D in a sensor operation period, and then settles the base potential Vbase of the phototransistor 101 to a Vb potential 309 (FIG. 4A). The potential 310 shown in FIG. 4D is a potential at which the MOSFET 102 for discharging an electric charge is turned ON, when the Vgate potential rises to a potential (Vlimit potential) in between the Vb potential and the power source voltage, as was described above.

In a period T3 in which the incident light quantity of the photo-sensor is equal to or larger than a predetermined quantity and increases, the MOSFET 102 for discharging an electric charge is turned ON when the base potential Vbase of the phototransistor 101 has risen to a Vlimit potential 307 (second potential). Therefore, an excessive charge is discharged to a drain of the MOSFET 102 for discharging an electric charge (see FIG. 4B and FIG. 4C).

After the current limiting operation, if the incident light quantity reaches a low luminance equal to or less than the predetermined quantity, the Vbase potential of the phototransistor 101 settles at the Vb potential 309 again (FIG. 4C). Here, the Vdrain potential 308 of the MOSFET 102 for discharging an electric charge is set at a potential between the Vb potential 309 (first potential) and the Vlimit potential 307 (second potential), as are illustrated in FIGS. 4A to 4D. By doing so, the MOSFET 102 for discharging an electric charge, which is the second MOSFET, can operate as a MOSFET for resetting a pixel as well.

A lateral overflow drain (hereinafter referred to as "LOD") is generally used for a photo-sensor which accumulates a photo-current in a parasitic capacitance of a photodiode. When the pixel is reset with the use of an LOD in such a photo-sensor, the drain potential of the LOD is set at the initial value of an accumulation potential.

In the present embodiment, a drain potential Vdrain 308 of a MOSFET 102 for discharging an electric charge is set at a middle in between a Vb potential 309 (first potential) and a Vlimit potential 307 (second potential), as was described above. As a result, the above method can realize a stable operation of resetting a pixel when applied to a photo-sensor which makes the base potential of the phototransistor unchanged, as is illustrated in the circuit of FIG. 3.

As was described above, when the incident light quantity of the phototransistor 101 is equal to or less than a predetermined quantity and the base potential of the phototransistor 101 is in the Vb potential 309 (first potential), the MOSFET 102 for discharging an electric charge, which is a second MOSFET, is turned OFF. In addition, when the incident light quantity of the phototransistor 101 is equal to or more than the predetermined quantity, a MOSFET 106 for detecting an electric current, which is a first MOSFET, operates in a saturation region (FIG. 4C).

When the base potential of the phototransistor 101 changes to the Vlimit potential 307 (second potential) from the Vb potential 309 (first potential), the MOSFET 102 for discharging an electric charge, which is the second MOSFET, is turned ON (FIG. 4C). By turning on the second MOSFET, an excessive photo signal is discharged.

Figure 5:
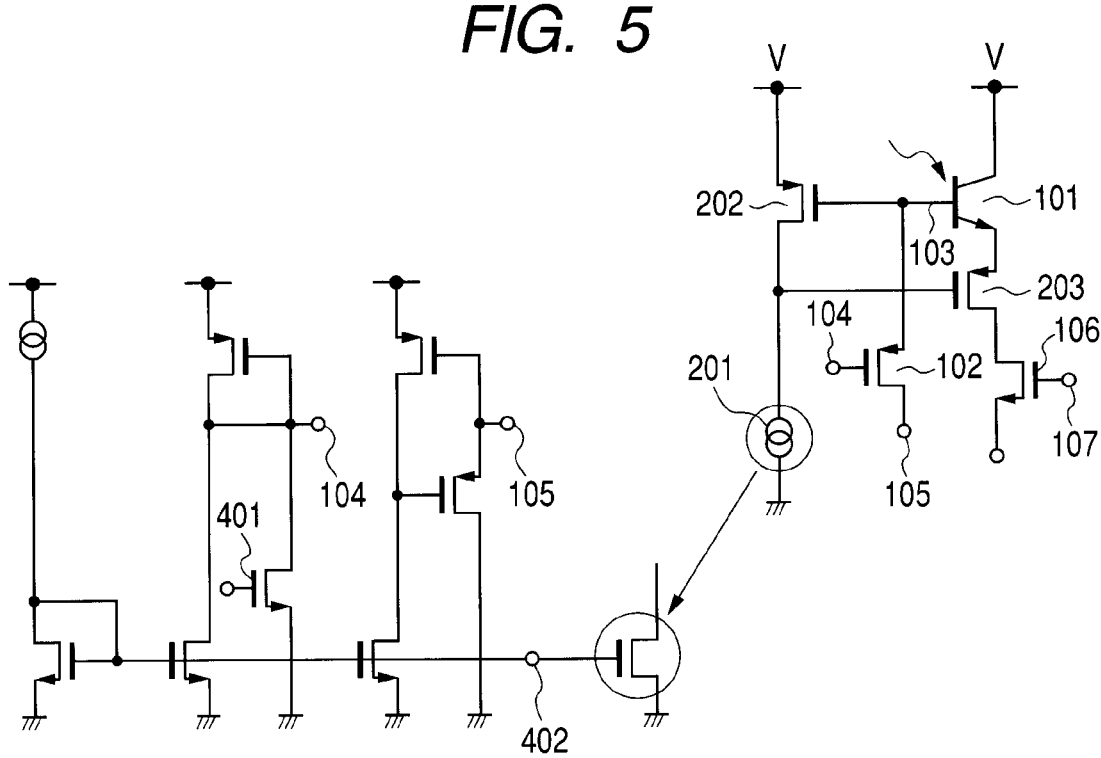
FIG. 5 is a circuit diagram illustrating one example of a circuit which generates a middle potential, in the photo-sensor of FIG. 3.

FIG. 5 illustrates one example of a circuit which generates a gate potential and a drain potential of a MOSFET 102 for discharging an electric charge, an electric current of a current source 201 and the like, in the photo-sensor of FIG. 3. FIG. 5 illustrates the circuit of the photo-sensor in FIG. 3, together. In the figure, a switch 401 (SW_RESET) is provided for setting a gate potential Vgate of the MOSFET 102 for discharging an electric charge at a GND potential in a pixel reset period T1. Terminals 104 and 105 in FIG. 5 are connected to a gate terminal 104 and a drain terminal 105 of the MOSFET 102 for discharging an electric charge, respectively.

By controlling the switch 401, the gate 104 of the MOSFET 102 for discharging an electric charge is controlled to the GND potential in the pixel reset period T1, and is controlled to a potential 310 illustrated in FIG. 4D in a sensor operation period.

A terminal (VCTRL) 402 controls a current value of a current source 201 illustrated in FIG. 3. As is illustrated in FIG. 5, the current source 201 includes a MOSFET, for instance, and the gate terminal receives a signal sent from the terminal 402. Therefore, a voltage between the gate and source of the MOSFET is determined, and the current quantity of the current source 201 is determined.

In this way, a reference current which generates a gate voltage and drain voltage of the MOSFET 102 for discharging an electric charge, which is a second MOSFET, is generated in the same circuit which generates a reference current that generates a voltage for controlling the base potential of a phototransistor 101.

The Vb potential 309, the Vgate potential 310 and the Vdrain potential 308, which were described above, vary due to influences of process variation and the like. When these parameters vary, a circuit operation cannot be correctly conducted. For instance, when the Vb potential 309 rises, the MOSFET 102 for discharging an electric charge tends to be easily turned ON, so that a photo-current leaks in a low luminance period.

In addition, when the Vb potential 309 becomes higher than the Vdrain potential 308, an electric charge cannot be correctly injected to a base terminal 103 of the phototransistor 101, in the pixel reset period T1 illustrated in FIGS. 4A to 4D. Then, the electric charge has to be injected with an infinitesimal photo-current, so that a period of time to be spent before the circuit of FIG. 3 settles in a stationary state becomes long.

In the present embodiment, two reference currents are generated from the terminal (VCTRL) 402 for controlling the current source 201 which determines the Vb potential 309, as is illustrated in FIG. 5. Those reference currents generate the Vgate potential 310 and the Vdrain potential 308, by being used as a drain current of the MOSFET which is connected through a diode.

For instance, when the threshold value of a PMOS increases due to the process variation, the Vb potential 309 is lowered if the current of the current source 201 does not change. On the other hand, the Vgate potential 310 and the Vdrain potential 308 are similarly lowered, causing the Vgate potential 310 and the Vdrain potential 308 to interlock with the variation of the Vb potential 310. A similar action occurs when the threshold value of the PMOS has decreased.

As a result, the circuit can interlock the process variation of the Vgate and the Vdrain with the process variation of Vb, and accordingly can realize a stable current limiting function against the process variation. For information, in the circuit of FIG. 1, FIG. 2, FIG. 3, FIG. 5 and the like, the polarity of each element of the phototransistor and the MOSFET may be replaced with those of reverse polarity. Specifically, an NPN type of a phototransistor may be replaced with a PNP type of a phototransistor, and an NMOS in the MOSFET may be replaced with a PMOS. Alternatively, a PMOS may be replaced with a NMOS.

Embodiment 2

Figure 6:
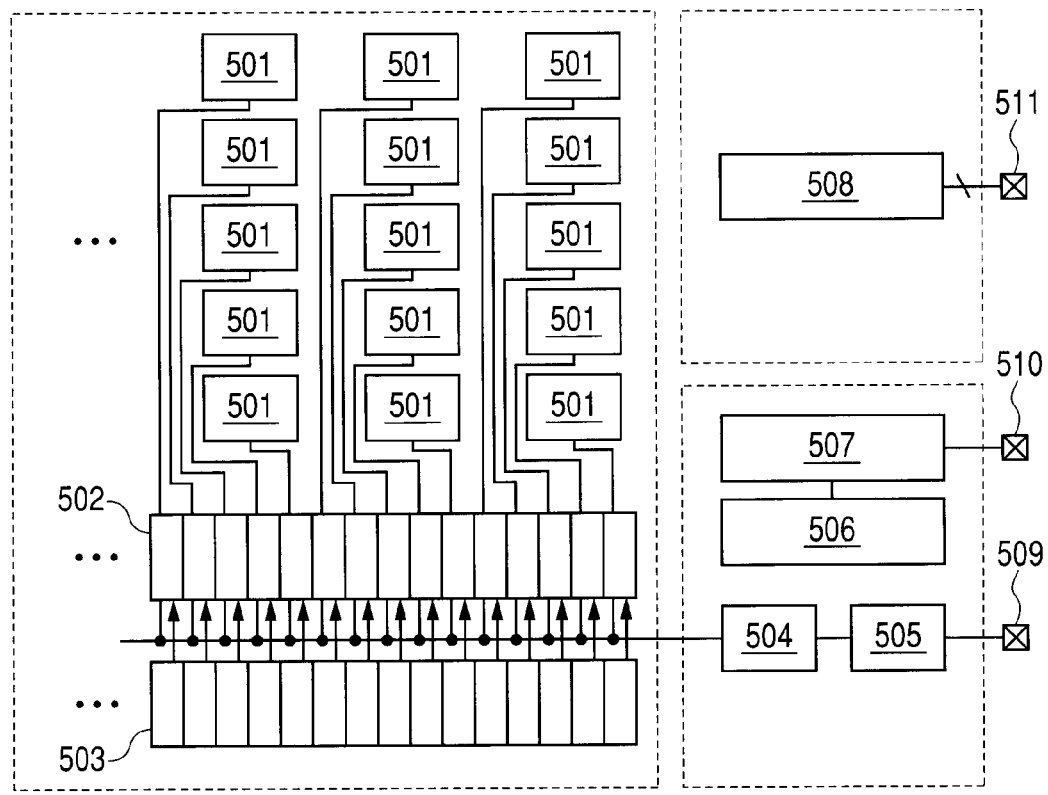
FIG. 6 is a block diagram illustrating one embodiment of a light measuring apparatus with the use of a photo-sensor according to the present invention.

FIG. 6 is a block diagram illustrating one embodiment where a photo-sensor according to the present invention is used as an AE sensor. In the figure, an AE pixel 501, a logarithmically-compressing integration circuit 502, a shift register 503 and an HFE compensation circuit 504 are shown. A gain circuit 505, a circuit 506 which generates an intermediate potential to be supplied to each block, and a band gap circuit 507 are also shown.

Furthermore, a TG circuit 508 which generates a timing of each block through communication with the outside, an AE signal output terminal 509, a band gap voltage output terminal 510 and a logic IO terminal 511 are shown.

The photo-sensor according to the present invention as described above is included in the AE pixel 501. However, a MOSFET 106 for detecting an electric current is arranged in the AE pixel 501 or the logarithmically-compressing integration circuit 502. The circuit illustrated in FIG. 5 is arranged in the circuit 506.

An HFE of the phototransistor in the logarithmically-compressing integration signal which has been output from the shift register 503 is canceled in the HFE compensation circuit 504, an appropriate gain is imposed to the signal in the gain circuit 505, and the resultant signal is output from the AE signal output terminal 509.

Embodiment 3

Figure 7:
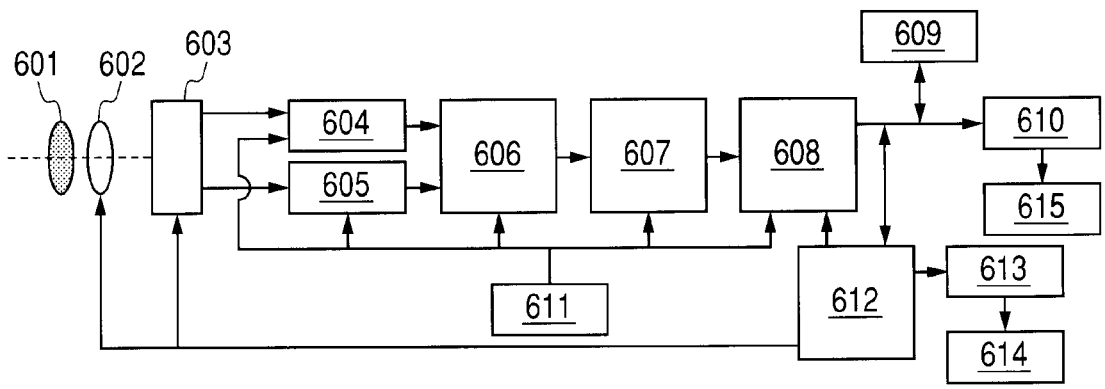
FIG. 7 is a block diagram illustrating one embodiment of a camera system with a light measuring apparatus according to the present invention.

FIG. 7 is a block diagram illustrating one embodiment of a camera system using an AE sensor according to the present invention. In the figure, a barrier 601 protects a lens which will be described below and also serves as a main switch, a lens 602 focuses an optical image of an object on a solid-state imaging device, and an aperture 603 adjusts the light quantity which has passed through the lens 602. A solid-state imaging apparatus 604 derives an image signal of the object which has been focused through the lens 602, and an AE sensor (light measuring apparatus) 605 uses the photo-sensor according to the present invention, which was described in FIG. 6.

An imaged-signal processing apparatus 606 processes a signal which is output from the solid-state imaging device or a focus detecting apparatus, and an A/D converter 607 converts the signal which has been output from an imaged-signal processing circuit from analog to digital form. A signal processing section 608 subjects an image data which has been output from the A/D converter 607 to various correction operations or a compression operation.

A memory section 609 temporarily stores the image data, an external I/F circuit 610 communicates with an external computer and the like, and a timing generation section 611 outputs various timing signals to the signal processing section 608 and the like. A whole control/arithmetic section 612 conducts various computings and controls the whole camera, an I/F section 613 controls a recording medium, and a recording medium 614 which is releasable such as a semiconductor memory records on or reads out from the recording medium. An external computer 615 is shown.

Next, an operation of the camera system in the present embodiment during picture taking will now be described. At first, the barrier 601 is opened, then a main power source is turned ON, subsequently a power source of a control system is turned ON, and a power source of an imaging circuit such as the A/D converter 607 is further turned ON. Subsequently, the whole control/arithmetic section 612 calculates a luminance of an object based on a signal which has been output from the light measuring apparatus 605.

After the luminance of the object has been measured, real light exposure starts. After the light exposure ends, the image signal which has been output from the solid-state imaging apparatus 604 is converted from analog to digital form by the A/D converter 607, passes through the signal processing section 608 and is written in the memory section 609 by the whole control/arithmetic section 612. Afterwards, the data accumulated in the memory section 609 passes through the I/F section 613 for controlling the recording medium while being controlled by the whole control/arithmetic section 612, and is recorded in the releasable recording medium 614. Alternatively, the data may pass through the external I/F section 610, and be directly input to the external computer 615 or the like.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2008-209779, filed Aug. 18, 2008, which is hereby incorporated by reference herein in its entirety.

What is claimed is:

1. A photo-sensor comprising:
   a phototransistor for receiving light to generate a photo-current and to output a current generated by amplifying the photo-current;
   a first MOSFET for detecting the current from the phototransistor; and
   a second MOSFET having a one non-controlling terminal connected to a base of the phototransistor,
   wherein the second MOSFET is turned OFF when a light quantity incident in the phototransistor is smaller than a predetermined value, and
   wherein the first MOSFET operates in a saturation region under a condition that the incident light quantity of the phototransistor is larger than a predetermined value, and
   wherein a gate potential of the second MOSFET is fixed so that the second MOSFET is turned ON when the light quantity incident in the phototransistor changes so as to be larger than the predetermined value during a sensor operation period for outputting the photo-current from the phototransistor.

2. The photo-sensor according to claim 1, wherein the second MOSFET further comprises another non-controlling terminal controlled to be set at a potential between first and second potentials, the first and second potentials being base potentials of the phototransistor.

3. The photo-sensor according to claim 1, wherein the second MOSFET is turned ON in a pixel reset period before the sensor operation period.

4. The photo-sensor according to claim 1, wherein a reference current for generating the gate potential of the second MOSFET and the potential between first and second potentials are generated by an identical circuit as the circuit for generating a reference potential for generating a potential for controlling a current of a current source of the photo-sensor, the first and second potentials being base potentials of the phototransistor.

5. The photo-sensor according to claim 1, wherein the phototransistor is a NPN type bipolar transistor, the first MOSFET is NMOS, and the second MOSFET is PMOS.

6. The photo-sensor according to claim 1, wherein the phototransistor is a PNP type bipolar transistor, the first MOSFET is PMOS, and the second MOSFET is NMOS.

7. A light measuring apparatus comprising a photo-sensor according to claim 1.

8. A camera system comprising:
   a light measuring apparatus according to claim 7;
   a solid-state imaging apparatus for obtaining an image signal of an object through a lens focusing the object; and
   a signal processing circuit for processing a signal from the light measuring apparatus and the solid-state imaging apparatus.

* * * * *